US012610501B2

(12) United States Patent
Zhu et al.

(10) Patent No.: US 12,610,501 B2
(45) Date of Patent: Apr. 21, 2026

(54) SINGLE-PHASE COLD PLATE LIQUID COOLING SYSTEM AND CONTROL METHOD THEREFOR, AND ELECTRONIC DEVICE

(71) Applicant: SUZHOU METABRAIN INTELLIGENT TECHNOLOGY CO., LTD., Suzhou (CN)

(72) Inventors: Huanlai Zhu, Suzhou (CN); Guangzhi Liu, Suzhou (CN)

(73) Assignee: SUZHOU METABRAIN INTELLIGENT TECHNOLOGY CO., LTD., Suzhou (CN)

( * ) Notice: Subject to any disclaimer, the term of this patent is extended or adjusted under 35 U.S.C. 154(b) by 0 days.

(21) Appl. No.: 19/115,752

(22) PCT Filed: Dec. 18, 2023

(86) PCT No.: PCT/CN2023/139594
§ 371 (c)(1),
(2) Date: Mar. 26, 2025

(87) PCT Pub. No.: WO2024/259921
PCT Pub. Date: Dec. 26, 2024

(65) Prior Publication Data
US 2025/0261336 A1 Aug. 14, 2025

(30) Foreign Application Priority Data
Jun. 21, 2023 (CN) .......................... 202310742164.0

(51) Int. Cl.
*H05K 7/20* (2006.01)
(52) U.S. Cl.
CPC ..... *H05K 7/20281* (2013.01); *H05K 7/20254* (2013.01); *H05K 7/20263* (2013.01); *H05K 7/20272* (2013.01)

(58) Field of Classification Search
None
See application file for complete search history.

(56) References Cited

U.S. PATENT DOCUMENTS

| | | | |
|---|---|---|---|
| 6,205,803 B1 * | 3/2001 | Scaringe | F25B 6/00 |
| | | | 165/263 |
| 6,786,056 B2 * | 9/2004 | Bash | H05K 7/20745 |
| | | | 62/229 |

(Continued)

FOREIGN PATENT DOCUMENTS

| | | |
|---|---|---|
| CN | 110779228 A | 2/2020 |
| CN | 110958818 A | 4/2020 |

(Continued)

OTHER PUBLICATIONS

CN214542355U English Machine Translation (Year: 2021).*

(Continued)

*Primary Examiner* — Jenna M Maroney
(74) *Attorney, Agent, or Firm* — Scully, Scott, Murphy & Presser, P.C.

(57) ABSTRACT

A single-phase cold plate liquid cooling system and a control method therefor, and an electronic device. The single-phase cold plate liquid cooling system includes a cooling pipeline, a detection assembly and an auxiliary pipeline, the cooling pipeline includes a heat exchanger and single-phase cold plate, the heat exchanger and the single-phase cold plate are in communication with each other, the cooling pipeline has a forward circulation mode and a reverse circulation mode; the detection assembly is arranged at the single-phase cold plate and/or a quick-connect joint of the cooling pipeline to detect an operating parameter; the auxiliary pipeline is in communication with the single-phase cold plate in an openable and closable manner; when the detection assembly detects that the operating parameter exceeds a preset value, (Continued)

a circulation mode of the cooling pipeline changes, and the auxiliary pipeline is in communication with the single-phase cold plate.

20 Claims, 2 Drawing Sheets

(56) References Cited

U.S. PATENT DOCUMENTS

| | | | | | |
|---|---|---|---|---|---|
| 6,828,675 | B2 * | 12/2004 | Memory | .............. | F28D 7/0025 |
| | | | | | 257/714 |
| 7,593,227 | B2 * | 9/2009 | Campbell | .......... | H05K 7/20772 |
| | | | | | 361/699 |
| 9,496,200 | B2 * | 11/2016 | Lyon | ..................... | H01L 23/473 |
| 10,212,857 | B2 * | 2/2019 | Eriksen | ............... | H05K 7/1488 |
| 10,820,450 | B2 * | 10/2020 | Lyon | .................. | H05K 7/20781 |
| 11,490,546 | B2 * | 11/2022 | Edmunds | .......... | H05K 7/20772 |
| 11,963,338 | B2 * | 4/2024 | Edmunds | .......... | H05K 7/20772 |
| 11,980,011 | B2 * | 5/2024 | Edmunds | .......... | H05K 7/20254 |
| 2008/0304236 | A1 * | 12/2008 | Murakami | ............ | H05K 7/207 |
| | | | | | 361/699 |
| 2011/0056675 | A1 * | 3/2011 | Barringer | ............. | H05K 7/2079 |
| | | | | | 165/80.4 |
| 2012/0147553 | A1 * | 6/2012 | Eriksen | ............. | H05K 7/20272 |
| | | | | | 361/679.53 |
| 2013/0025818 | A1 * | 1/2013 | Lyon | .................. | H05K 7/20781 |
| | | | | | 165/181 |
| 2014/0069626 | A1 * | 3/2014 | Lin | ........................... | G06F 1/20 |
| | | | | | 165/287 |
| 2021/0120703 | A1 * | 4/2021 | Subrahmanyam | ........................... | |
| | | | | | H05K 7/20263 |
| 2022/0201896 | A1 * | 6/2022 | Edmunds | .......... | H05K 7/20781 |
| 2022/0346285 | A1 | 10/2022 | Heydari | | |
| 2023/0025369 | A1 * | 1/2023 | Subrahmanyam | ........................... | |
| | | | | | H05K 7/20836 |
| 2024/0377144 | A1 * | 11/2024 | Greiciunas | ............. | G06F 1/206 |

FOREIGN PATENT DOCUMENTS

| | | | | | | |
|---|---|---|---|---|---|---|
| CN | 214542355 | U | | 10/2021 | | |
| CN | 114501955 | A | | 5/2022 | | |
| CN | 115297681 | A | * | 11/2022 | ......... | H05K 7/20872 |
| CN | 115942722 | A | | 4/2023 | | |
| CN | 116528572 | A | | 8/2023 | | |
| CN | 118741978 | A | * | 10/2024 | ......... | H05K 7/20172 |
| WO | WO-2013151526 | A1 | * | 10/2013 | .......... | H01M 10/643 |
| WO | WO-2020234599 | A1 | * | 11/2020 | ......... | H05K 7/20509 |

OTHER PUBLICATIONS

The search report of CN application No. 202310742164.0 issued on Aug. 2, 2023.
The search report of PCT application No. PCT/CN2023/139594 issued on Mar. 26, 2024.
Written Opinion of PCT application No. PCT/CN2023/139594 issued on Mar. 26, 2024.

* cited by examiner

SINGLE-PHASE COLD PLATE LIQUID COOLING SYSTEM AND CONTROL METHOD THEREFOR, AND ELECTRONIC DEVICE

CROSS-REFERENCE TO RELATED APPLICATIONS

The present disclosure is a National Stage Filing of the PCT International Application No. PCT/CN2023/139594 filed on Dec. 18, 2023, which claims priority and the benefit of Chinese Patent Application No. 202310742164.0, filed with the China National Intellectual Property Administration (CNIPA) on Jun. 21, 2023 and entitled "Single-phase Cold Plate Liquid Cooling System and Control Method Therefor, and Electronic Device", which is herein incorporated by reference in its entirety.

TECHNICAL FIELD

The present disclosure relate to the technical field of computers, and in particular to a single-phase cold plate liquid cooling system and a control method therefor, and an electronic device.

BACKGROUND

In the related art, with the implementation of the national big data strategy and the national strategy of accelerating the building of Digital China, as well as the vigorous development of cloud computing and big data, the power density of individual cabinets becomes higher and higher in order to meet the ever increasing demand for the computing power of big data, and air cooling systems are approaching to their effective cooling limits. In this case, liquid-cooled data center heat dissipation technologies with low PUE and high heat-dissipation density emerge as required. Among these, single-phase cold plate liquid cooling technology has the natural advantages of allowing for easy operation and maintenance and being well-suited for retrofitting existing air-cooled data centers, and therefore has gained a dominant position in the application market of liquid cooling technology.

However, in single-phase cold plate liquid cooling technology, in order to improve the cooling efficiency of the single-phase cold plate, a plurality of capillary channels are typically arranged in parallel within the single-phase cold plate, the capillary channels are extremely prone to blockage, which leads to reduced cooling efficiency. Moreover, the quick-connect joint of the cooling system is usually made of a metal material, and the cooling liquid has a vortex generation zone and a circulation dead zone at the position where the cooling liquid flows through the quick-connect joint, such that electrochemical corrosion easily occurs at the quick-connect joint. This has become a difficult problem for the later maintenance of single-phase cold plate liquid cooling.

SUMMARY

The present disclosure provide a single-phase cold plate liquid cooling system and a control method therefor, and an electronic device, so as to at least solve the problem in the related art that blockage or electrochemical corrosion of a cooling liquid easily occurs at a single-phase cold plate and a quick-connect joint.

Some embodiments of the present disclosure provide a single-phase cold plate liquid cooling system, including a cooling pipeline, a detection assembly and an auxiliary pipeline, the cooling pipeline includes a heat exchanger and at least one single-phase cold plate, the heat exchanger and the single-phase cold plate are in communication with each other, and the cooling pipeline has a forward circulation mode and a reverse circulation mode; the detection assembly is arranged at the single-phase cold plate and/or a quick-connect joint of the cooling pipeline to detect an operating parameter of the cooling pipeline; the auxiliary pipeline is in communication with the single-phase cold plate in an openable and closable manner, and the auxiliary pipeline is provided with a vacuum generation device; when the detection assembly detects that the operating parameter exceeds a preset value, a circulation mode of the cooling pipeline changes, and the auxiliary pipeline is in communication with the single-phase cold plate.

In some embodiments, the cooling pipeline includes a first connection branch and a second connection branch, and when the cooling pipeline is in the forward circulation mode, the single-phase cold plate is in communication with the heat exchanger by the first connection branch; and when the cooling pipeline is in the reverse circulation mode, the single-phase cold plate is in communication with the heat exchanger by the second connection branch.

In some embodiments, the cooling pipeline further includes a main pipeline, and the single-phase cold plate is respectively in selective communication with the first connection branch and the second connection branch by the main pipeline.

In some embodiments, the cooling pipeline further includes a first circulation pump and a second circulation pump, the first circulation pump is arranged on the first connection branch, and when the main pipeline is in communication with the first connection branch, the first circulation pump is located upstream of the heat exchanger; and the second circulation pump is arranged on the second connection branch, and when the main pipeline is in communication with the second connection branch, the second circulation pump is located upstream of the heat exchanger.

In some embodiments, the cooling pipeline further includes a first switch valve and a second switch valve, the first switch valve is arranged on the first connection branch, and the heat exchanger is located between the first circulation pump and the first switch valve; the second switch valve is arranged on the second connection branch, and the heat exchanger is located between the second circulation pump and the second switch valve; when the cooling pipeline is in the forward circulation mode, the first switch valve is opened, and the second switch valve is closed; and when the cooling pipeline is in the reverse circulation mode, the first switch valve is closed, and the second switch valve is opened.

In some embodiments, the cooling pipeline further includes a first water tank and a second water tank which are respectively in communication with the main pipeline, the first water tank is arranged between the single-phase cold plate and the first circulation pump, and the second water tank is arranged between the single-phase cold plate and the second circulation pump.

In some embodiments, the auxiliary pipeline includes a third water tank, and the third water tank is in communication with an end, away from the single-phase cold plate, of the vacuum generation device.

In some embodiments, the auxiliary pipeline further includes a third connection branch and a fourth connection branch, the third water tank is in communication with the first water tank by the third connection branch; and the third water tank is in communication with the second water tank by the fourth connection branch.

In some embodiments, the auxiliary pipeline further includes a third switch valve and a fourth switch valve, the third switch valve is arranged on the third connection branch; the fourth switch valve is arranged on the fourth connection branch; when the cooling pipeline is in the forward circulation mode, the third switch valve is opened, and the fourth switch valve is closed; and when the cooling pipeline is in the reverse circulation mode, the third switch valve is closed, and the fourth switch valve is opened.

In some embodiments, there are a plurality of single-phase cold plates, the plurality of single-phase cold plates are arranged in parallel, and the plurality of single-phase cold plates are all connected to the main pipeline.

In some embodiments, the cooling pipeline further includes a plurality of fifth switch valves and a plurality of sixth switch valves, and at least one fifth switch valve and at least one sixth switch valve are respectively arranged on two sides of at least one single-phase cold plate.

In some embodiments, when there are the plurality of single-phase cold plates, a number of the plurality of fifth switch valves, a number of the plurality of sixth switch valves and a number of the plurality of single-phase cold plates are the same and the plurality of fifth switch valves, the plurality of sixth switch valves and the plurality of single-phase cold plates correspond to each other on a one-to-one basis, and one fifth switch valve and one sixth switch valve are respectively arranged on two sides of each single-phase cold plate.

In some embodiments, the auxiliary pipeline includes a fifth connection branch and a sixth connection branch, the fifth connection branch and the sixth connection branch are respectively in communication with the same end of the vacuum generation device, and the vacuum generation device is in communication with two ends of the single-phase cold plate by the fifth connection branch and the sixth connection branch respectively.

In some embodiments, the auxiliary pipeline further includes a seventh switch valve and an eighth switch valve, the seventh switch valve is arranged on the fifth connection branch; the eighth switch valve is arranged on the sixth connection branch; when the cooling pipeline is in the forward circulation mode, the eighth switch valve is closed; and when the cooling pipeline is in the reverse circulation mode, the seventh switch valve is closed, and the eighth switch valve is opened.

In some embodiments, the single-phase cold plate liquid cooling system further includes a data acquisition unit and a control unit, the data acquisition unit is in signal connection with the detection assembly; and the control unit is respectively in signal connection with the data acquisition unit, the cooling pipeline and the auxiliary pipeline, so as to control the circulation mode of the cooling pipeline and an opening and closing of the auxiliary pipeline according to received information from the data acquisition unit.

In some embodiments, the detection assembly includes at least one of a pressure sensor and a conductivity detector.

In some embodiments, the cooling pipeline further includes a plurality of bidirectional filters, and at least one bidirectional filter is arranged on each of two ends of each single-phase cold plate.

In some embodiments, the cooling pipeline includes a first connection branch, a second connection branch and a main pipeline, the single-phase cold plate is respectively in selective communication with the first connection branch and the second connection branch by the main pipeline; the cooling pipeline further includes a first circulation pump and a second circulation pump, the first circulation pump is arranged on the first connection branch, and when the main pipeline is in communication with the first connection branch, the first circulation pump is located upstream of the heat exchanger, the second circulation pump is arranged on the second connection branch, and when the main pipeline is in communication with the second connection branch, the second circulation pump is located upstream of the heat exchanger; the cooling pipeline further includes a first switch valve and a second switch valve, the first switch valve is arranged on the first connection branch, and the heat exchanger is located between the first circulation pump and the first switch valve, the second switch valve is arranged on the second connection branch, and the heat exchanger is located between the second circulation pump and the second switch valve; the cooling pipeline further includes a first water tank and a second water tank which are respectively in communication with the main pipeline, the first water tank is arranged between the single-phase cold plate and the first circulation pump, and the second water tank is arranged between the single-phase cold plate and the second circulation pump; when the cooling pipeline is in the forward circulation mode, the first switch valve is opened, the second switch valve is closed, and the first circulation pump draws out the cooling liquid in the first water tank; and when the cooling pipeline is in the reverse circulation mode, the first switch valve is closed, the second switch valve is opened, and the second circulation pump draws out the cooling liquid in the second water tank.

Some other embodiments of the present disclosure provide a control method for a single-phase cold plate liquid cooling system, applied to the above described single-phase cold plate liquid cooling system, including: detecting an operating parameter of a cooling pipeline by a detection assembly; and in response to the detection assembly detecting that the operating parameter exceeds a preset value, a circulation mode of the cooling pipeline changes, and an auxiliary pipeline is in communication with a single-phase cold plate of the cooling pipeline.

Still some other embodiments of the present disclosure provide an electronic device, including the above described single-phase cold plate liquid cooling system.

By applying the technical solution of the present disclosure, the single-phase cold plate liquid cooling system in the present disclosure includes a cooling pipeline, a detection assembly and an auxiliary pipeline, the cooling pipeline includes a heat exchanger and at least one single-phase cold plate, the heat exchanger and the single-phase cold plate are in communication with each other, and the cooling pipeline has a forward circulation mode and a reverse circulation mode; the detection assembly is arranged at the single-phase cold plate and/or a quick-connect joint of the cooling pipeline to detect an operating parameter of the cooling pipeline; the auxiliary pipeline is in communication with the single-phase cold plate in an openable and closable manner, and the auxiliary pipeline is provided with a vacuum generation device; upon detection by the detection assembly that the operating parameter exceeds a preset value, the circulation mode of the cooling pipeline changes, and the auxiliary pipeline is in communication with the single-phase cold plate.

When the single-phase cold plate liquid cooling system in the present disclosure is used, the cooling pipeline of the single-phase cold plate liquid cooling system has the forward circulation mode and the reverse circulation mode, for example, the cooling pipeline is in the forward circulation mode for heat exchange, when electrochemical corrosion of a cooling liquid occurs or dirt and impurities block the liquid cooling system at the single-phase cold plate and the quick-connect joint, the operating parameter detected by the detection assembly exceeds a preset value, the circulation mode of the cooling pipeline changes, and the auxiliary pipeline is in communication with the single-phase cold plate. Thus, by means of the reverse circulation of the single-phase cold plate liquid cooling system and the suction effect of the vacuum generation device, impurities and dirt at the single-phase cold plate and the quick-connect joint are flushed out to prevent blockage; moreover, the reverse circulation breaks the rotation direction of the vortex, and new cooling liquid flows into the original circulation dead zone, eliminating or mitigating local electrochemical corrosion. The present disclosure solves the problem that electrochemical corrosion and blockage easily occur at a single-phase cold plate and a quick-connect joint, thereby achieving the effects of improving stability and maintenance convenience of a liquid cooling system.

The drawings include the following reference signs:

10: cooling pipeline; 11: heat exchanger; 111: heat exchange body; 112: heat exchange pipeline; 1121: third circulation pump; 1122: heat dissipation end; 12: single phase cold plate; 13: first connection branch; 14: second connection branch; 15: main pipeline; 16: first circulation pump; 17: second circulation pump; 18: first switch valve; 19: second switch valve; 110: first water tank; 120: second water tank; 130: fifth switch valve; 140: sixth switch valve; 150: bidirectional filter; 160: quick-connect joint;

20: auxiliary pipeline; 21: vacuum generation device; 22: third water tank; 23: third connection branch; 24: fourth connection branch; 25: third switch valve; 26: fourth switch valve; 27: fifth connection branch; 28: sixth connection branch; 29: seventh switch valve; 210: eighth switch valve; 30: data acquisition unit; 40: control unit; 2: main board; 50: detection assembly; 51: pressure sensor; 52: conductivity detector.

DETAILED DESCRIPTION OF THE EMBODIMENTS

The embodiments of the present disclosure will be described below in detail with reference to the drawings and in conjunction with the embodiments.

It should be noted that, terms such as "first" and "second" in the description and the claims of the present disclosure and the described drawings are used to distinguish similar objects, but are not necessarily used to describe a specific sequence or order.

In order to solve the problem in the related art that blockage or electrochemical corrosion of a cooling liquid easily occurs at a single-phase cold plate and a quick-connect joint, the present disclosure provides a single-phase cold plate liquid cooling system and a control method therefor, and an electronic device.

Furthermore, the electronic device in the present disclosure includes a main board 2 and the single-phase cold plate liquid cooling system described below.

Figure 1:
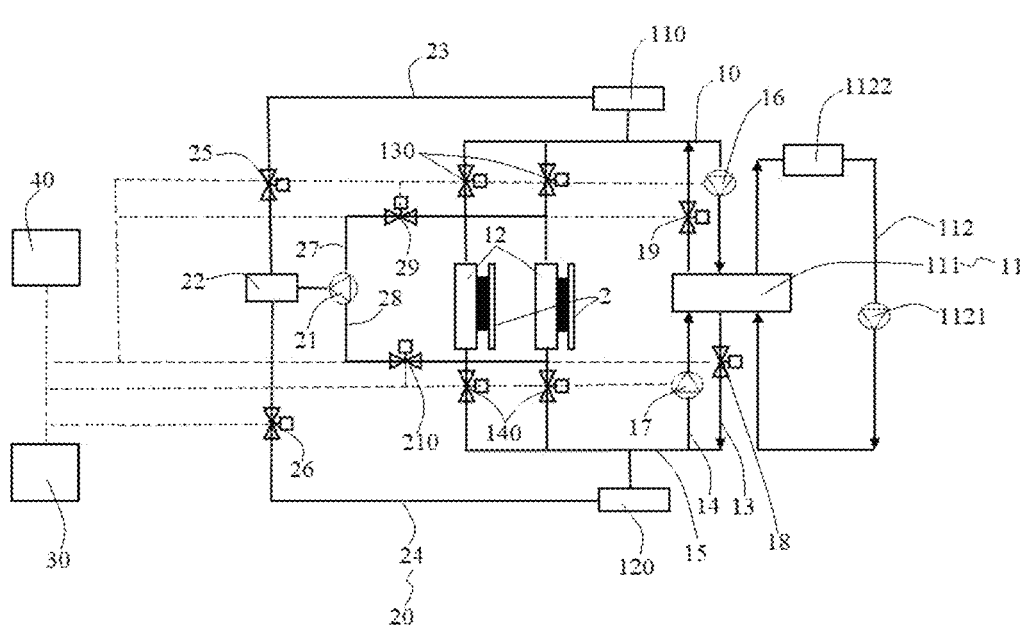
FIG. 1 is a system schematic diagram of a single-phase cold plate liquid cooling system with a bidirectional filter omitted according to the present disclosure.
Figure 2:
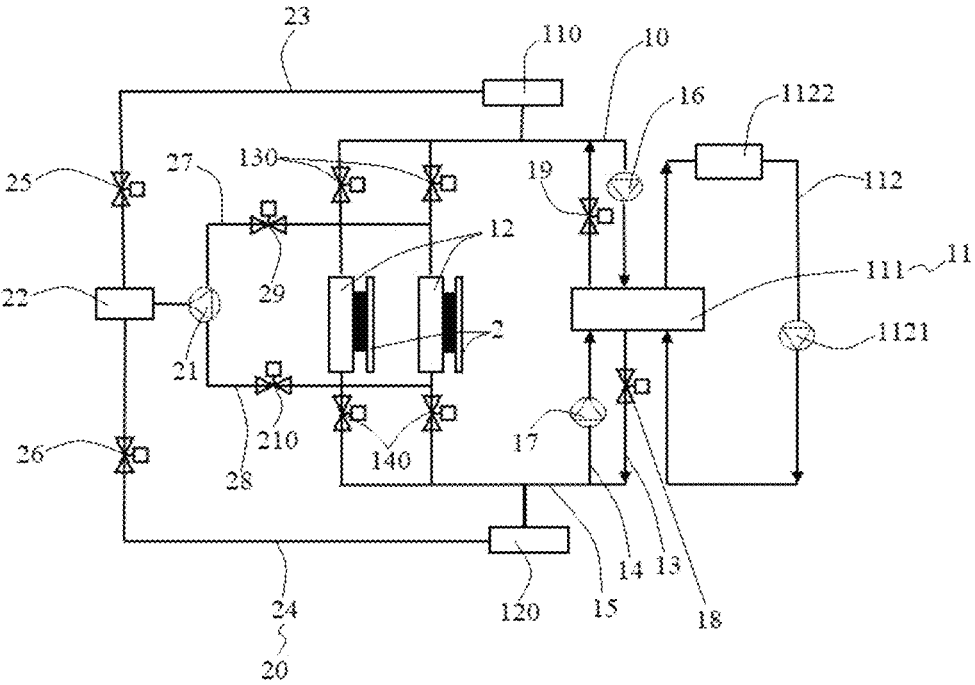
FIG. 2 is a system schematic diagram of the single-phase cold plate liquid cooling system with a data acquisition unit and a control unit omitted in FIG. 1.
Figure 3:
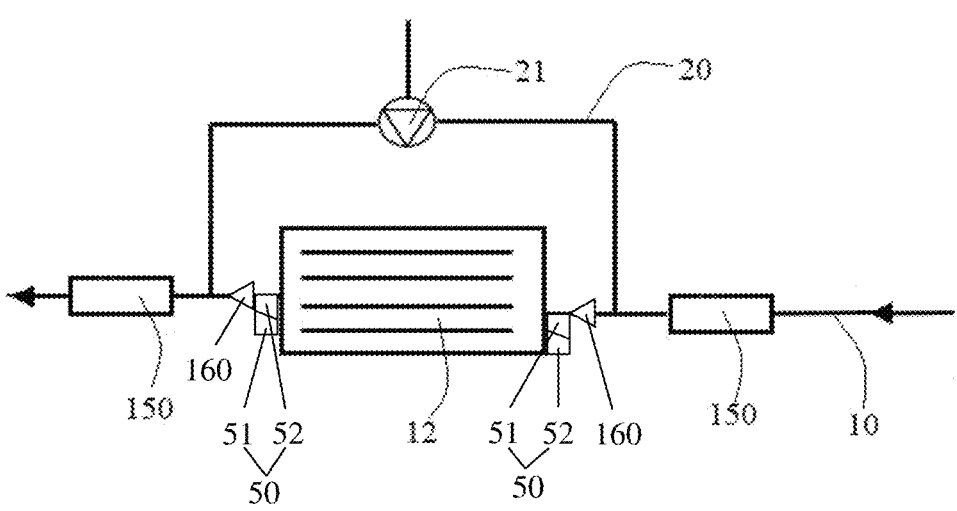
FIG. 3 is a local system schematic diagram of the single-phase cold plate liquid cooling system with bidirectional filters respectively arranged on two ends of a unidirectional cold plate in FIG. 1.

As shown in FIGS. 1-3, the single-phase cold plate liquid cooling system includes a cooling pipeline 10, a detection assembly 50 and an auxiliary pipeline 20, the cooling pipeline 10 includes a heat exchanger 11 and at least one single-phase cold plate 12, the heat exchanger 11 and the single-phase cold plate 12 are in communication with each other, and the cooling pipeline 10 has a forward circulation mode and a reverse circulation mode; the detection assembly 50 is arranged at the single-phase cold plate 12 and a quick-connect joint 160 of the cooling pipeline 10 to detect an operating parameter of the cooling pipeline 10; the auxiliary pipeline 20 is in communication with the single-phase cold plate 12 in an openable and closable manner, and the auxiliary pipeline 20 is provided with a vacuum generation device 21; when the detection assembly 50 detects that the operating parameter exceeds a preset value, a circulation mode of the cooling pipeline 10 changes, and the auxiliary pipeline 20 is in communication with the single-phase cold plate 12.

When the single-phase cold plate liquid cooling system in the present disclosure is used, the cooling pipeline 10 of the single-phase cold plate liquid cooling system has the forward circulation mode and the reverse circulation mode, for example, the cooling pipeline 10 is in the forward circulation mode for heat exchange, when electrochemical corrosion of a cooling liquid occurs or dirt and impurities block the liquid cooling system at the single-phase cold plate 12 and the quick-connect joint 160, the operating parameter detected by the detection assembly 50 exceeds a preset value, the circulation mode of the cooling pipeline 10 changes, and the auxiliary pipeline 20 is in communication with the single-phase cold plate 12. Thus, by means of the reverse circulation of the single-phase cold plate liquid cooling system and the suction effect of the vacuum generation device 21, impurities and dirt at the single-phase cold plate 12 and the quick-connect joint 160 are flushed out to prevent blockage; moreover, the reverse circulation breaks the rotation direction of the vortex, and new cooling liquid flows into the original circulation dead zone, eliminating or mitigating local electrochemical corrosion. The present disclosure solves the problem that electrochemical corrosion and blockage easily occur at a single-phase cold plate 12 and a quick-connect joint 160, thereby achieving the effects of improving stability and maintenance convenience of a liquid cooling system.

It should be noted that, in the present disclosure, the single-phase cold plate 12 is connected to a heat source of the main board 2, and is configured for dissipating heat of the main board 2.

In an embodiment, as shown in FIG. 2, the cooling water in the forward circulation mode circulates in a clockwise direction, and the cooling water in the reverse circulation mode circulates in a counter-clockwise direction.

As shown in FIGS. 1-2, the cooling pipeline 10 includes a first connection branch 13 and a second connection branch 14, and when the cooling pipeline 10 is in the forward circulation mode, the single-phase cold plate 12 is in communication with the heat exchanger 11 by the first connection branch 13; and when the cooling pipeline 10 is in the reverse circulation mode, the single-phase cold plate 12 is in communication with the heat exchanger 11 by the second connection branch 14. In this way, a direction in which the cooling liquid flows through the heat exchanger 11 by the first connection branch 13 is opposite to a direction in which the cooling liquid flows through the heat exchanger 11 by the second connection branch 14. By controlling a communication between the single-phase cold plate 12 and the first connection branch 13 or a communication between the single-phase cold plate 12 and the second connection branch 14, the cooling pipeline 10 is controlled to switch between the forward circulation mode and the reverse circulation mode.

As shown in FIGS. 1-2, the cooling pipeline 10 further includes a main pipeline 15, and the single-phase cold plate 12 is respectively in selective communication with the first connection branch 13 and the second connection branch 14 by the main pipeline 15. In this way, when the cooling pipeline 10 is in the forward circulation mode, the single-phase cold plate 12 is in communication with the first connection branch 13 by the main pipeline 15, and when the cooling pipeline 10 is in the reverse circulation mode, the single-phase cold plate 12 is in communication with the second connection branch 14 by the main pipeline 15. That is to say, in the forward circulation mode and the reverse circulation mode in the present disclosure, not only the flow directions of the cooling water are different, but also the flow paths of the cooling water are not completely overlapped.

As shown in FIGS. 1-2, the cooling pipeline 10 further includes a first circulation pump 16 and a second circulation pump 17, the first circulation pump 16 is arranged on the first connection branch 13, and when the main pipeline 15 is in communication with the first connection branch 13, the first circulation pump 16 is located upstream of the heat exchanger 11; and the second circulation pump 17 is arranged on the second connection branch 14, and when the main pipeline 15 is in communication with the second connection branch 14, the second circulation pump 17 is located upstream of the heat exchanger 11. In this way, the first circulation pump 16 and the second circulation pump 17 provide power for the flow of the cooling liquid in the cooling pipeline 10. The first circulation pump 16 drives the cooling liquid to circulate through the main pipeline 15 and the first connection branch 13, so as to realize the forward circulation of the cooling liquid in the cooling pipeline 10; and the second circulation pump 17 drives the cooling liquid to circulate through the main pipeline 15 and the second connection branch 14, so as to realize the reverse circulation of the cooling liquid in the cooling pipeline 10.

As shown in FIGS. 1-2, the cooling pipeline 10 further includes a first switch valve 18 and a second switch valve 19, the first switch valve 18 is arranged on the first connection branch 13, and the heat exchanger 11 is located between the first circulation pump 16 and the first switch valve 18; the second switch valve 19 is arranged on the second connection branch 14, and the heat exchanger 11 is located between the second circulation pump 17 and the second switch valve 19; when the cooling pipeline 10 is in the forward circulation mode, the first switch valve 18 is opened, and the second switch valve 19 is closed; and when the cooling pipeline 10 is in the reverse circulation mode, the first switch valve 18 is closed, and the second switch valve 19 is opened. In this way, by controlling the opening and closing of the first switch valve 18 and the second switch valve 19, the main pipeline 15 is controlled to be in communication with one of the first connection branch 13 or the second connection branch 14, so as to ensure the cooling pipeline 10 to switch between the forward circulation mode and the reverse circulation mode.

As shown in FIGS. 1-2, the cooling pipeline 10 further includes a first water tank 110 and a second water tank 120 which are respectively in communication with the main pipeline 15, the first water tank 110 is arranged between the single-phase cold plate 12 and the first circulation pump 16, and the second water tank 120 is arranged between the single-phase cold plate 12 and the second circulation pump 17. In this way, in the forward circulation mode of the cooling pipeline 10, the cooling liquid stored in the first water tank 110 circulates through the main pipeline 15 and the first connection branch 13 by the first circulation pump 16, and in the reverse circulation mode of the cooling pipeline 10, the cooling liquid stored in the second water tank 120 circulates through the main pipeline 15 and the second connection branch 14 by the second circulation pump 17.

It should be noted that, in the present disclosure, the heat exchanger 11 includes a heat exchange body 111 and a heat exchange pipeline 112, the heat exchange pipeline 112 is connected to the heat exchange body 111, the heat exchange pipeline 112 is configured for performing heat exchange on the heat exchange body 111, and the heat exchange pipeline 112 includes a third circulation pump 1121 and a heat dissipation end 1122, the cooling liquid circulates through the heat exchange body 111, the heat dissipation end 1122 and the third circulation pump 1121 in sequence on the heat exchanger 11.

In an embodiment, a direction in which the cooling liquid in the heat exchange pipeline 112 flows through the heat exchange body 111 is opposite to a direction in which the cooling liquid flows through the heat exchange body 111 in the forward circulation mode of the cooling pipeline 10, and the direction in which the cooling liquid in the heat exchange pipeline 112 flows through the heat exchange body 111 is the same as the direction in which the cooling liquid flows through the heat exchange body 111 in the reverse circulation mode of the cooling pipeline 10.

As shown in FIGS. 1-2, the auxiliary pipeline 20 includes a third water tank 22, and the third water tank 22 is in communication with an, away from the single-phase cold plate 12, end of the vacuum generation device 21. In this way, the water vapor formed by the vaporization of the cooling liquid in the single-phase cold plate 12 enters the third water tank 22 by the suction effect of the vacuum generation device 21 for liquefaction and storage.

As shown in FIGS. 1-2, the auxiliary pipeline 20 further includes a third connection branch 23 and a fourth connection branch 24, the third water tank 22 is in communication with the first water tank 110 by the third connection branch 23; and the third water tank 22 is in communication with the second water tank 120 by the fourth connection branch 24. In this way, the cooling liquid in the third water tank 22 may flow into the first water tank 110 by the third connection branch 23, or the cooling liquid in the third water tank 22 flows into the second water tank 120 by the fourth connection branch 24, so as to recycle the cooling liquid and save the cost.

As shown in FIGS. 1-2, the auxiliary pipeline 20 further includes a third switch valve 25 and a fourth switch valve 26, the third switch valve 25 is arranged on the third connection branch 23; the fourth switch valve 26 is arranged on the fourth connection branch 24; when the cooling pipeline 10 is in the forward circulation mode, the third switch valve 25 is opened, and the fourth switch valve 26 is closed; and when the cooling pipeline 10 is in the reverse circulation mode, the third switch valve 25 is closed, and the fourth switch valve 26 is opened. In this way, when the cooling pipeline 10 is in the positive circulation mode, the third switch valve 25 is opened and the fourth switch valve 26 is closed, and the cooling liquid in the third water tank 22 flows into the first water tank 110 by the third connection branch 23. When the cooling pipeline 10 is in the reverse circulation mode, the third switch valve 25 is closed and the fourth switch valve 26 is opened, and the cooling liquid in the third water tank 22 flows into the second water tank 120 by the fourth connection branch 24.

As shown in FIGS. 1-2, when there are a plurality of single-phase cold plates 12, the plurality of single-phase cold plates 12 are arranged in parallel, and the plurality of single-phase cold plates 12 are all connected to the main pipeline 15. In this way, the cooling pipeline 10 is able to simultaneously cool the plurality of single-phase cold plates 12 arranged in parallel, thereby improving the cooling efficiency.

As shown in FIGS. 1-2, the cooling pipeline 10 further includes a plurality of fifth switch valves 130 and a plurality of sixth switch valves 140, and at least one fifth switch valve 130 and at least one sixth switch valve 140 are respectively arranged on two sides of at least one single-phase cold plate 12. In this way, by controlling the simultaneous opening or closing of the plurality of fifth switch valves 130 and the plurality of sixth switch valves 140, the single-phase cold plate 12 located between the fifth switch valve 130 and the sixth switch valve 140 is controlled to be in a cooling working state or a non-cooling off state. When the fifth switch valve 130 and the sixth switch valve 140 are opened at the same time, the single-phase cold plate 12 is in the cooling working state; and when the fifth switch valve 130 and the sixth switch valve 140 are closed at the same time, the single-phase cold plate 12 is in the non-cooling off state.

As shown in FIGS. 1-2, when there are the plurality of single-phase cold plates 12, a number of the plurality of fifth switch valves 130, a number of the plurality of sixth switch valves 140 and a number of the plurality of single-phase cold plates 12 are the same and the plurality of fifth switch valves 130, the plurality of sixth switch valves 140 and the plurality of single-phase cold plates 12 correspond to each other on a one-to-one basis, and one fifth switch valve 130 and one sixth switch valve 140 are respectively arranged on two sides of each single-phase cold plate 12. In this way, opening and closing states of the plurality of fifth switch valves 130 and the plurality of sixth switch valves 140 are able to be adjusted according to actual situations, such that some of single-phase cold plates 12 required for cooling among a plurality of single-phase cold plates 12 are in a cooling working state, and some of single-phase cold plates 12 not required for cooling are in a non-cooling off state.

As shown in FIGS. 1-2, the auxiliary pipeline 20 includes a fifth connection branch 27 and a sixth connection branch 28, the fifth connection branch 27 and the sixth connection branch 28 are respectively in communication with the same end of the vacuum generation device 21, and the vacuum generation device 21 is in communication with two ends of the single-phase cold plate 12 by the fifth connection branch 27 and the sixth connection branch 28 respectively. In this way, when the cooling pipeline 10 is in the forward circulation mode, one end of the single-phase cold plate 12 is in communication with the vacuum generation device 21 by the fifth connection branch 27, and when the cooling pipeline 10 is in the reverse circulation mode, the other end of the single-phase cold plate 12 is in communication with the vacuum generation device 21 by the sixth connection branch 28.

As shown in FIGS. 1-2, the auxiliary pipeline 20 further includes a seventh switch valve 29 and an eighth switch valve 210, the seventh switch valve 29 is arranged on the fifth connection branch 27; the eighth switch valve 210 is arranged on the sixth connection branch 28; when the cooling pipeline 10 is in the forward circulation mode, the eighth switch valve 210 is closed; and when the cooling pipeline 10 is in the reverse circulation mode, the seventh switch valve 29 is closed, and the eighth switch valve 210 is opened. In this way, the cooling pipeline 10 performs heat exchange in the forward circulation mode. When the detection assembly 50 detects that the operating parameter exceeds a preset value, the cooling pipeline 10 switches to the reverse circulation mode, the seventh switch valve 29 is closed, the eighth switch valve 210 is opened, and the vacuum generation device 21 is in communication with an outlet end of the single-phase cold plate 12, such that dirt and impurities in the single-phase cold plate 12 can be suctioned, preventing capillary channels in the single-phase cold plate 12 from being blocked.

In an embodiment, the seventh switch valve 29 is opened, and the eighth switch valve 210 is closed when the cooling pipeline 10 is in the forward circulation mode.

As shown in FIG. 1, the single-phase cold plate liquid cooling system further includes a data acquisition unit 30 and a control unit 40, the data acquisition unit 30 is in signal connection with the detection assembly 50; and the control unit 40 is respectively in signal connection with the data acquisition unit 30, the cooling pipeline 10 and the auxiliary pipeline 20, so as to control the circulation mode of the cooling pipeline 10 and an opening and closing of the auxiliary pipeline 20 according to received information from the data acquisition unit 30. In this way, for example, the control unit 40 controls the cooling pipeline 10 to be in the forward circulation mode for heat exchange, when the operating parameter acquired by the data acquisition unit 30 by the detection assembly 50 exceeds a preset value, the control unit 40 controls the cooling pipeline 10 to switch to the reverse circulation mode for heat exchange, and at the same time, the control unit 40 controls the auxiliary pipeline 20 to be opened. In this case, the cooling pipeline 10 is in the reverse circulation mode for heat exchange, when the operating parameter acquired by the data acquisition unit 30 by the detection assembly 50 exceeds the preset value again, the control unit 40 controls the cooling pipeline 10 to switch to the forward circulation mode, and at the same time, the control unit 40 controls the auxiliary pipeline 20 to be opened.

It should be noted that, in the present disclosure, the control unit 40 is respectively in signal connection with the first circulation pump 16, the second circulation pump 17, the first switch valve 18, the second switch valve 19, the fifth switch valve 130 and the sixth switch valve 140 of the cooling pipeline 10, and is respectively in signal connection with the third switch valve 25, the fourth switch valve 26, the seventh switch valve 29 and the eighth switch valve 210 of the auxiliary pipeline 20, and is in signal connection with the third circulation pump 1121 of the heat exchanger 11.

As shown in FIG. 1, the detection assembly 50 includes at least one of a pressure sensor 51 and a conductivity detector 52. In this way, when the pressure sensor 51 detects that the pressure difference between an inlet end and an outlet end of the single-phase cold plate 12 or the quick-connect joint 160 of the cooling pipeline 10 exceeds a preset pressure difference value, the circulation mode of the cooling pipeline 10 changes, and the auxiliary pipeline 20 is in communication with the single-phase cold plate 12; alternatively, when the conductivity detector 52 detects that at least one of the conductivities of the inlet end and outlet end of the single-phase cold plate 12 or the quick-connect joint 160 of the cooling pipeline 10 exceeds a preset conductivity value, the circulation mode of the cooling pipeline 10 changes, and the auxiliary pipeline 20 is in communication with the single-phase cold plate 12.

In an embodiment of the present disclosure, the preset conductivity value is 10 mS/cm. In an embodiment, there are a plurality of pressure sensors 51, wherein one pressure sensor 51 is arranged on each of two ends of each single-phase cold plate 12, and the data acquisition unit 30 is configured for acquiring a pressure difference between two pressure sensors 51 on two ends of each single-phase cold plate 12.

In another embodiment, there are a plurality of pressure sensors 51, wherein one pressure sensor 51 is arranged on each of two ends of each quick-connect joint 160 of the cooling pipeline 10, and the data acquisition unit 30 is configured for acquiring a pressure difference between two pressure sensors 51 on two ends of each quick-connect joint 160.

In an embodiment, there are a plurality of conductivity detectors 52, wherein one conductivity detector 52 is arranged on each of two ends of each single-phase cold plate 12, and the data acquisition unit 30 is configured for acquiring the conductivities on two ends of each single-phase cold plate 12.

In another embodiment, there are a plurality of conductivity detectors 52, wherein one conductivity detector 52 is arranged on each of two ends of each quick-connect joint 160 of the cooling pipeline 10, and the data acquisition unit 30 is configured for acquiring the conductivities on two ends of each quick-connect joint.

It should be noted that, in the present disclosure, as a plurality of capillary channels are arranged in parallel within the single-phase cold plate 12, the small overflow area of the plurality of capillary channels results in that the plurality of capillary channels are extremely prone to blockage at the inlets, increasing thermal resistance and flow resistance of a heat system, which is manifested as a high temperature of a heat source such as a Central Processing Unit (CPU) or a large pressure difference between the inlet and the outlet of the single-phase cold plate 12, and this tendency becomes increasingly significant over time. By arranging one pressure sensor 51 on each of two ends of the single-phase cold plate 12, when the pressure difference value between two ends of the single-phase cold plate 12 acquired by the data acquisition unit 30 is greater than the preset pressure difference value, the circulation mode of the cooling pipeline 10 changes, and the auxiliary pipeline 20 is in communication with the single-phase cold plate 12. By means of the reverse circulation of the single-phase cold plate liquid cooling system and the suction effect of the vacuum generator, impurities and dirt at the inlets of the capillary channels are flushed out into the bidirectional filter 150 to prevent blockage, improving system stability and reliability as well as system maintenance convenience.

It should be noted that, in the present disclosure, because the quick-connect joint 160 is made of a metal material, the cooling liquid is usually deionized water and anti-freezing liquid, the cooling liquid has a vortex generation zone and a circulation dead zone at the position where the cooling liquid flows through the quick-connect joint 160, such that an electrochemical corrosion concentration area is easily formed at the quick-connect joint 160, necessarily accompanying electrochemical corrosion of a plurality of metal materials. By arranging one conductivity detector 52 on each of two ends of a quick-connect joint 160, when any conductivity value of two ends of the quick-connect joint 160 acquired by the data acquisition unit 30 is greater than the preset conductivity value, the circulation mode of the cooling pipeline 10 changes, and the auxiliary pipeline 20 is in communication with the single-phase cold plate 12; and the reverse circulation of the single-phase cold plate liquid cooling system breaks the rotation direction of the vortex, and new cooling liquid flows into the original circulation dead zone, eliminating or mitigating local electrochemical corrosion.

As shown in FIG. 3, the cooling pipeline 10 further includes a plurality of bidirectional filters 150, and at least one bidirectional filter 150 is arranged on each of two ends of each single-phase cold plate 12. In this way, the plurality of bidirectional filters 150 are able to perform bidirectional filtering on the cooling liquid in the cooling pipeline 10 flowing through the single-phase cold plate 12, and whether the cooling pipeline 10 is in the forward circulation mode or the reverse circulation mode, the plurality of capillary channels in the single-phase cold plate 12 are able to be prevented from being blocked.

As shown in FIGS. 1-2, the vacuum generation device 21 is a vacuum generator. In this way, the suction effect of the vacuum generator enables impurities and dirt at inlets of the plurality of capillary channels in the single-phase cold plate 12 to be flushed out into the plurality of bidirectional filters 150 to be filtered out.

As shown in FIGS. 1-2, the cooling pipeline 10 includes a first connection branch 13, a second connection branch 14 and a main pipeline 15, the single-phase cold plate 12 is respectively in selective communication with the first connection branch 13 and the second connection branch 14 by the main pipeline 15; the cooling pipeline 10 further includes a first circulation pump 16 and a second circulation pump 17, the first circulation pump 16 is arranged on the first connection branch 13, and when the main pipeline 15 is in communication with the first connection branch 13, the first circulation pump 16 is located upstream of the heat exchanger 11, the second circulation pump 17 is arranged on the second connection branch 14, and when the main pipeline 15 is in communication with the second connection branch 14, the second circulation pump 17 is located upstream of the heat exchanger 11; the cooling pipeline 10 further includes a first switch valve 18 and a second switch valve 19, the first switch valve 18 is arranged on the first connection branch 13, and the heat exchanger 11 is located between the first circulation pump 16 and the first switch valve 18, the second switch valve 19 is arranged on the second connection branch 14, and the heat exchanger 11 is located between the second circulation pump 17 and the second switch valve 19; the cooling pipeline 10 further includes a first water tank 110 and a second water tank 120 which are respectively in communication with the main pipeline 15, the first water tank 110 is arranged between the single-phase cold plate 12 and the first circulation pump 16, and the second water tank 120 is arranged between the single-phase cold plate 12 and the second circulation pump 17; when the cooling pipeline 10 is in the forward circulation mode, the first switch valve 18 is opened, the second switch valve 19 is closed, and the first circulation pump 16 draws out the cooling liquid in the first water tank 110; and when the cooling pipeline 10 is in the reverse circulation mode, the first switch valve 18 is closed, the second switch valve 19 is opened, and the second circulation pump 17 draws out the cooling liquid in the second water tank 120.

It should be noted that, in the present disclosure, the circulating flow of the cooling liquid on the side of the heat exchange body 111 and the heat exchange pipeline 112 may be referred to as primary side cooling water circulation, the circulating flow of the cooling liquid on the cooling pipeline 10 may be referred to as secondary side deionized water or anti-freezing liquid circulation, and the circulating flow of the cooling liquid on the auxiliary pipeline 20 may be referred to as an auxiliary circulation system.

It should be noted that, according to the embodiments of the present disclosure, a control method for a single-phase cold plate liquid cooling system is as follows:

In normal operation, the control unit 40 controls the first circulation pump 16 and the third circulation pump 1121 to be opened and the second circulation pump 17 to be closed, and the control unit 40 controls the first switch valve 18 to be opened and the second switch valve 19 to be closed, the fifth switch valve 130 and the sixth switch valve 140 to be opened, the third switch valve 25 and the seventh switch valve 29 to be opened, and the fourth switch valve 26 and the eighth switch valve 210 to be closed. At this time, the cooling pipeline 10 is in a forward circulation mode, the cooling liquid flows out of the first water tank 110, and flows through the first circulation pump 16, the heat exchange body 111 and the first switch valve 18 on the first connection branch 13, and the sixth switch valve 140, the single-phase cold plate 12 and the fifth switch valve 130 arranged in parallel on the main pipeline 15 in sequence in the cooling pipeline 10 to return to the first circulation pump 16. A small amount of vaporized condensate flowing out of the outlet end of the single-phase cold plate 12 flows through the seventh switch valve 29 on the fifth connection branch 27, the vacuum generation device 21, the third water tank 22, and the third switch valve 25 on the third connection branch 23 to return to the first water tank 110.

When the pressure difference value between two ends of the single-phase cold plate 12 acquired by the data acquisition unit 30 by the detection assembly 50 exceeds a preset pressure value, it is indicated that the plurality of capillary channels in the single-phase cold plate 12 are blocked, or when any conductivity value of two ends of the quick-connect joint 160 acquired by the acquisition module 30 by the detection assembly 50 is greater than a preset conductivity value, it is indicated that electrochemical corrosion occurs at the quick-connect joint 160. If either of the described two cases occurs, the control unit 40 controls the circulation mode of the cooling pipeline 10 to switch from the forward circulation mode to the reverse circulation mode, the control unit 40 controls the second circulation pump 17 to be opened and the first circulation pump 16 to be closed, and the control unit 40 controls the first switch valve 18 to be closed and the second switch valve 19 to be opened, the third switch valve 25 and the seventh switch valve 29 to be closed, and the fourth switch valve 26 and the eighth switch valve 210 to be opened. At this time, the cooling liquid flows out of the second water tank 120, and flows through the second circulation pump 17, the heat exchange body 111 and the second switch valve 19 on the second connection branch 14, and the fifth switch valve 130, the single-phase cold plate 12 and the sixth switch valve 140 arranged in parallel on the main pipeline 15 in sequence in the cooling pipeline 10 to return to the second circulation pump 17. A small amount of vaporized condensate flowing out of the outlet end of the single-phase cold plate 12 flows through the eighth switch valve 210 on the sixth connection branch 28, the vacuum generation device 21, the third water tank 22, and the fourth switch valve 26 on the fourth connection branch 24 to return to the second water tank 120.

By means of the reverse circulation of the single-phase cold plate liquid cooling system and the suction effect of the vacuum generator, impurities and dirt at the inlets of the plurality of capillary channels are flushed out into the plurality of bidirectional filters 150 to prevent blockage; and the reverse circulation breaks the rotation direction of the vortex, and new cooling liquid flows into the original circulation dead zone, eliminating or mitigating local electrochemical corrosion.

Definitely, there is another control method for the single-phase cold plate liquid cooling system, and the another control method is as follows:

In normal operation, the control unit 40 controls the first circulation pump 16 and the third circulation pump 1121 to be opened and the second circulation pump 17 to be closed, and the control unit 40 controls the first switch valve 18 to be opened and the second switch valve 19 to be closed, the fifth switch valve 130 and the sixth switch valve 140 to be opened, the third switch valve 25 and the seventh switch valve 29 to be closed, and the fourth switch valve 26 and the eighth switch valve 210 to be closed. At this time, the cooling pipeline 10 is in the forward circulation mode, the cooling liquid flows out of the first water tank 110, and flows through the first circulation pump 16, the heat exchange body 111 and the first switch valve 18 on the first connection branch 13, and the sixth switch valve 140, the single-phase cold plate 12 and the fifth switch valve 130 arranged in parallel on the main pipeline 15 in sequence in the cooling pipeline 10 to return to the first circulation pump 16. The cooling liquid flowing out of the outlet end of the single-phase cold plate 12 enters all the way back to the first circulation pump 16 completely.

When the pressure difference value between two ends of the single-phase cold plate 12 acquired by the data acquisition unit 30 by the detection assembly 50 exceeds a preset pressure value, it is indicated that the plurality of capillary channels in the single-phase cold plate 12 are blocked, or when any conductivity value of two ends of the quick-connect joint 160 acquired by the acquisition module 30 by the detection assembly 50 is greater than a preset conductivity value, it is indicated that electrochemical corrosion occurs at the quick-connect joint 160. If either of the described two cases occurs, the control unit 40 controls the circulation mode of the cooling pipeline 10 to switch from the forward circulation mode to the reverse circulation mode, the control unit 40 controls the second circulation pump 17 to be opened and the first circulation pump 16 to be closed, and the control unit 40 controls the first switch valve 18 to be closed and the second switch valve 19 to be opened, the third switch valve 25 and the seventh switch valve 29 to be closed, and the fourth switch valve 26 and the eighth switch valve 210 to be opened. At this time, the cooling liquid flows out of the second water tank 120, and flows through the second circulation pump 17, the heat exchange body 111 and the second switch valve 19 on the second connection branch 14, and the fifth switch valve 130, the single-phase cold plate 12 and the sixth switch valve 140 arranged in parallel on the main pipeline 15 in sequence in the cooling pipeline 10 to return to the second circulation pump 17. The small amount of vaporized condensate flowing out of the outlet end of the single-phase cold plate 12 flows through the eighth switch valve 210 on the sixth connection branch 28, the vacuum generation device 21, the third water tank 22, and the fourth switch valve 26 on the fourth connection branch 24 to return to the second water tank 120.

By means of the reverse circulation of the single-phase cold plate liquid cooling system and the suction effect of the vacuum generator, impurities and dirt at the inlets of the plurality of capillary channels are flushed out into the plurality of bidirectional filters 150 to prevent blockage; and the reverse circulation breaks the rotation direction of the vortex, and new cooling liquid flows into the original circulation dead zone, eliminating or mitigating local electrochemical corrosion.

In an embodiment, the single-phase cold plate liquid cooling system is different from the described embodiment in that: the auxiliary pipeline 20 does not include the third connection branch 23 and the fourth connection branch 24, the third water tank 22 of the single-phase cold plate liquid cooling system is disconnected from the first water tank 110, the third water tank 22 is disconnected from the second water tank 120, and a volume of the third water tank 22 is greater than a sum of the volumes of the first water tank 110 and the second water tank 120, such that when the cooling pipeline 10 is in the forward circulation mode, the cooling liquid in the first water tank 110 circulates on the cooling pipeline 10 in a forward direction, and when the cooling pipeline 10 is in the reverse circulation mode, the cooling liquid in the second water tank 120 circulates on the cooling pipeline 10 in a reverse direction, and when the cooling pipeline 10 is in the forward circulation mode or the reverse circulation mode, the third water tank 22 is configured for storing the cooling liquid suctioned into the third water tank 22 by the vacuum generation device 21.

The control method for a single-phase cold plate liquid cooling system in the present disclosure is applied to the described single-phase cold plate liquid cooling system, and includes: detecting an operating parameter of a cooling pipeline 10 by a detection assembly 50; and in response to the detection assembly 50 detecting that the operating parameter exceeds a preset value, a circulation mode of the cooling pipeline 10 changes, and an auxiliary pipeline 20 is in communication with a single-phase cold plate 12 of the cooling pipeline 10.

From the above description, it can be seen that the described embodiments of the present disclosure achieve the following technical effects:

1. When dirt and impurities in the plurality of capillary channels of the single-phase cold plate 12 block the liquid cooling system, the pressure difference between two ends of the single-phase cold plate 12 increases, and when the pressure difference is greater than a preset pressure difference value, the circulation mode of the cooling pipeline 10 changes, and the auxiliary pipeline 20 is in communication with the single-phase cold plate 12, such that by means of the reverse circulation of the cooling pipeline 10 and the suction effect of the vacuum generator, impurities and dirt at the inlets of the capillary channels are flushed out to prevent blockage, improving stability and reliability as well as maintenance convenience of the liquid cooling system.

2. When electrochemical corrosion occurs in a vortex zone and a circulation dead zone formed between the cooling liquid of the cooling pipeline 10 and the quick-connect joint 160, the conductivity of the cooling liquid flowing through the quick-connect joint 160 increases, and when the conductivity is greater than a preset conductivity value, the circulation mode of the cooling pipeline 10 changes, and the auxiliary pipeline

20 is in communication with the single-phase cold plate 12, such that by means of the reverse circulation of the cooling pipeline 10 and the suction effect of the vacuum generator, the reverse circulation breaks the rotation direction of the vortex, and new cooling liquid flows into the original circulation dead zone, eliminating or mitigating local electrochemical corrosion.

3. The third water tank 22 is in communication with the first water tank 110 by the third connection branch 23, and the third water tank 22 is in communication with the second water tank 120 by the fourth connection branch 24, thereby recycling the cooling liquid and saving the cost.

4. A plurality of single-phase cold plates 12 are arranged in parallel, and at least one fifth switch valve 130 and at least one sixth switch valve 140 are respectively arranged on two sides of at least one single-phase cold plate 12, such that the cooling efficiency is improved, and an operating state of each single-phase cold plate 12 can be selected, thereby improving the practicability of a single-phase cold plate liquid cooling system.

5. The first circulation pump 16 and the second circulation pump 17 provide power for the flow of the cooling liquid in the cooling pipeline 10, the first circulation pump 16 drives the cooling liquid to circulate through the main pipeline 15 and the first connection branch 13, so as to realize the forward circulation of the cooling liquid in the cooling pipeline 10; and the second circulation pump 17 drives the cooling liquid to circulate through the main pipeline 15 and the second connection branch 14, so as to realize the reverse circulation of the cooling liquid in the cooling pipeline 10.

Obviously, the described embodiments are merely some rather than all of the embodiments of the present disclosure. All other embodiments obtained by a person of ordinary skill in the art based on the embodiments of the present disclosure without inventive efforts shall belong to the scope of protection of the present disclosure.

It should be noted that the terminology used herein is for the purpose of describing particular embodiments only and is not intended to limit the exemplary embodiments in accordance with the present disclosure. As used herein, the singular form is intended to include the plural form as well, unless the context clearly indicates otherwise, and further it should be understood that the terms "contain" and/or "include" when used in this description, specify the presence of features, steps, operations, devices, components, and/or combinations thereof.

It should be noted that, terms such as "first" and "second" in the description and the claims of the present disclosure and the described drawings are used to distinguish similar objects, but are not necessarily used to describe a specific sequence or order. It should be understood that the data so used may be interchanged where appropriate such that the embodiments of the present disclosure described herein can be implemented in sequences other than those illustrated or described herein.

The foregoing descriptions are merely specific embodiments of the present disclosure, and are not intended to limit the present disclosure. For those skilled in the art, the present disclosure may have various modifications and variations. Any modifications, equivalent replacements, improvements and the like made within the principle of the present disclosure shall belong to the scope of protection of the present disclosure.

What is claimed is:

1. A single-phase cold plate liquid cooling system, comprising:

a cooling pipeline, wherein the cooling pipeline comprises a heat exchanger and at least one single-phase cold plate, the heat exchanger and the single-phase cold plate are in communication with each other, and the cooling pipeline has a forward circulation mode and a reverse circulation mode;

a detection assembly, the detection assembly is arranged at the single-phase cold plate and/or a quick-connect joint of the cooling pipeline to detect an operating parameter of the cooling pipeline; and an auxiliary pipeline, the auxiliary pipeline is in communication with the single-phase cold plate in an openable and closable manner, and the auxiliary pipeline is provided with a vacuum generation device;

in response to the detection assembly detecting that the operating parameter exceeds a preset value, a circulation mode of the cooling pipeline changes, and the auxiliary pipeline is in communication with the single-phase cold plate.

2. The single-phase cold plate liquid cooling system according to claim 1, wherein the cooling pipeline comprises a first connection branch and a second connection branch, in response to the cooling pipeline being in the forward circulation mode, the single-phase cold plate is in communication with the heat exchanger by the first connection branch; and in response to the cooling pipeline being in the reverse circulation mode, the single-phase cold plate is in communication with the heat exchanger by the second connection branch.

3. The single-phase cold plate liquid cooling system according to claim 2, wherein the cooling pipeline further comprises a main pipeline, the single-phase cold plate is respectively in selective communication with the first connection branch and the second connection branch by the main pipeline.

4. The single-phase cold plate liquid cooling system according to claim 3, wherein the cooling pipeline further comprises:

a first circulation pump, wherein the first circulation pump is arranged on the first connection branch, and in response to the main pipeline being in communication with the first connection branch, the first circulation pump is located upstream of the heat exchanger; and a second circulation pump, wherein the second circulation pump is arranged on the second connection branch, and in response to the main pipeline being in communication with the second connection branch, the second circulation pump is located upstream of the heat exchanger.

5. The single-phase cold plate liquid cooling system according to claim 4, wherein the cooling pipeline further comprises:

a first switch valve, wherein the first switch valve is arranged on the first connection branch, and the heat exchanger is located between the first circulation pump and the first switch valve; and a second switch valve, wherein the second switch valve is arranged on the second connection branch, and the heat exchanger is located between the second circulation pump and the second switch valve;

in response to the cooling pipeline being in the forward circulation mode, the first switch valve is opened, and the second switch valve is closed; and in response to the cooling pipeline being in the reverse circulation mode, the first switch valve is closed, and the second switch valve is opened.

6. The single-phase cold plate liquid cooling system according to claim 4, wherein the cooling pipeline further comprises a first water tank and a second water tank which are respectively in communication with the main pipeline, the first water tank is arranged between the single-phase cold plate and the first circulation pump, and the second water tank is arranged between the single-phase cold plate and the second circulation pump.

7. The single-phase cold plate liquid cooling system according to claim 6, wherein the auxiliary pipeline comprises a third water tank, the third water tank is in communication with an end, away from the single-phase cold plate, of the vacuum generation device.

8. The single-phase cold plate liquid cooling system according to claim 7, wherein the auxiliary pipeline further comprises:

a third connection branch, wherein the third water tank is in communication with the first water tank by the third connection branch; and a fourth connection branch, wherein the third water tank is in communication with the second water tank by the fourth connection branch.

9. The single-phase cold plate liquid cooling system according to claim 8, wherein the auxiliary pipeline further comprises:

a third switch valve, wherein the third switch valve is arranged on the third connection branch; and a fourth switch valve, wherein the fourth switch valve is arranged on the fourth connection branch;

in response to the cooling pipeline being in the forward circulation mode, the third switch valve is opened, and the fourth switch valve is closed; and in response to the cooling pipeline being in the reverse circulation mode, the third switch valve is closed, and the fourth switch valve is opened.

10. The single-phase cold plate liquid cooling system according to claim 3, wherein there are a plurality of single-phase cold plates, the plurality of single-phase cold plates are arranged in parallel, and the plurality of single-phase cold plates are all connected to the main pipeline.

11. The single-phase cold plate liquid cooling system according to claim 10, wherein the cooling pipeline further comprises a plurality of fifth switch valves and a plurality of sixth switch valves, at least one fifth switch valve and at least one sixth switch valve are respectively arranged on two sides of at least one single-phase cold plate.

12. The single-phase cold plate liquid cooling system according to claim 11, wherein in response to the plurality of single-phase cold plates, a number of the plurality of fifth switch valves, a number of the plurality of sixth switch valves and a number of the plurality of single-phase cold plates are the same and the plurality of fifth switch valves, the plurality of sixth switch valves and the plurality of single-phase cold plates correspond to each other on a one-to-one basis, and one fifth switch valve and one sixth switch valve are respectively arranged on two sides of each single-phase cold plate.

13. The single-phase cold plate liquid cooling system according to claim 1, wherein the auxiliary pipeline comprises a fifth connection branch and a sixth connection branch, the fifth connection branch and the sixth connection branch are respectively in communication with the same end of the vacuum generation device, and the vacuum generation device is in communication with two ends of the single-phase cold plate by the fifth connection branch and the sixth connection branch respectively.

14. The single-phase cold plate liquid cooling system according to claim 13, wherein the auxiliary pipeline further comprises:

a seventh switch valve, wherein the seventh switch valve is arranged on the fifth connection branch; and an eighth switch valve, wherein the eighth switch valve is arranged on the sixth connection branch;

in response to the cooling pipeline being in the forward circulation mode, the eighth switch valve is closed; and in response to the cooling pipeline being in the reverse circulation mode, the seventh switch valve is closed, and the eighth switch valve is opened.

15. The single-phase cold plate liquid cooling system according to claim 1, wherein the single-phase cold plate liquid cooling system further comprises:

a data acquisition unit, wherein the data acquisition unit is in signal connection with the detection assembly; and a control unit, wherein the control unit is respectively in signal connection with the data acquisition unit, the cooling pipeline and the auxiliary pipeline, so as to control the circulation mode of the cooling pipeline and an opening and closing of the auxiliary pipeline according to received information from the data acquisition unit.

16. The single-phase cold plate liquid cooling system according to claim 1, wherein the detection assembly comprises at least one of a pressure sensor and a conductivity detector; and/or the vacuum generation device is a vacuum generator.

17. The single-phase cold plate liquid cooling system according to claim 1, wherein the cooling pipeline further comprises a plurality of bidirectional filters, and at least one bidirectional filter is arranged on each of two ends of each single-phase cold plate.

18. The single-phase cold plate liquid cooling system according to claim 1, wherein the cooling pipeline comprises a first connection branch, a second connection branch and a main pipeline, the single-phase cold plate is respectively in selective communication with the first connection branch and the second connection branch by the main pipeline; the cooling pipeline further comprises a first circulation pump and a second circulation pump, the first circulation pump is arranged on the first connection branch, and in response to the main pipeline being in communication with the first connection branch, the first circulation pump is located upstream of the heat exchanger, the second circulation pump is arranged on the second connection branch, and in response to the main pipeline being in communication with the second connection branch, the second circulation pump is located upstream of the heat exchanger; the cooling pipeline further comprises a first switch valve and a second switch valve, the first switch valve is arranged on the first connection branch, and the heat exchanger is located between the first circulation pump and the first switch valve, the second switch valve is arranged on the second connection branch, and the heat exchanger is located between the second circulation pump and the second switch valve; the cooling pipeline further comprises a first water tank and a second water tank which are respectively in communication with the main pipeline, the first water tank is arranged between the single-phase cold plate and the first circulation pump, and the second water tank is arranged between the single-phase cold plate and the second circulation pump, in response to the cooling pipeline being in the forward circulation mode, the first switch valve is opened, the second switch valve is closed, and the first circulation pump draws out a cooling liquid in the first water tank; and in response to the cooling pipeline being in the reverse circulation mode, the first switch valve is closed, the second switch valve is opened, and the second circulation pump draws out the cooling liquid in the second water tank.

19. A control method for a single-phase cold plate liquid cooling system, applied to the single-phase cold plate liquid cooling system according to claim 1, comprising:

detecting the operating parameter of the cooling pipeline by the detection assembly; and in response to the detection assembly detecting that the operating parameter exceeds the preset value, the circulation mode of the cooling pipeline changing, and the auxiliary pipeline is in communication with the single-phase cold plate of the cooling pipeline.

20. An electronic device, comprising the single-phase cold plate liquid cooling system according to claim 1.

* * * * *